United States Patent [19]

Hartleroad et al.

[11] 3,937,386

[45] Feb. 10, 1976

[54] FLIP CHIP CARTRIDGE LOADER

[75] Inventors: Ronald J. Hartleroad, Twelve Mile; James P. Grabowski, Carmel, both of Ind.

[73] Assignee: General Motors Corporation, Detroit, Mich.

[22] Filed: Nov. 9, 1973

[21] Appl. No.: 414,222

[52] U.S. Cl. ............... 228/180; 228/6; 228/49; 29/203 J; 29/589; 214/1 R
[51] Int. Cl.² ............................................. H05K 3/30
[58] Field of Search ........... 29/203 P, 203 J, 203 V, 29/589, 576 S, 626, 628, 471.1; 228/4–6, 180, 44.1, 49; 214/1 R, 152; 198/254

[56] References Cited
UNITED STATES PATENTS

| | | | |
|---|---|---|---|
| 3,341,030 | 9/1967 | Engels | 214/152 X |
| 3,612,955 | 10/1971 | Butherus et al. | 29/471.1 X |
| 3,698,618 | 10/1972 | Helda | 228/3 |
| 3,709,424 | 1/1973 | Drees | 29/471.1 X |
| 3,722,072 | 3/1973 | Beyerlein | 29/471.1 X |
| 3,731,377 | 5/1973 | Muckelroy | 29/626 |
| 3,776,394 | 12/1973 | Miller | 214/152 X |

OTHER PUBLICATIONS
Merritt, "Transistor Inserting Machine" IBM Tech. Disclosure Bul. Vol. 2, No. 6, Apr. 1960, pp. 61–62.

*Primary Examiner*—Harold D. Whitehead
*Assistant Examiner*—K. J. Ramsey
*Attorney, Agent, or Firm*—Robert J. Wallace

[57] ABSTRACT

A method and apparatus for positioning semiconductor flip chips onto one end of a transfer probe which automatically magnetically aligns the chips with an overlying lead frame structure for bonding thereto. The flip chips are placed into one end of an elongated groove in a positioning apparatus and conveyed between guide rails thereof to successively locate the chips over an opening at the opposite end of the groove. A magnetic force is transmitted through a soft ferromagnetic probe which extends through the opening to engage the back side of the chip thereover. The probe raises the chip from the positioning apparatus and carries it into close proximity with overlying corresponding fingers of a conductive lead frame structure. The magnetic force automatically orients the flip chip contact bumps with their corresponding fingers and simultaneously raises the chip up from the probe into precisely aligned engagement with the lead frame fingers so that it can be bonded thereto.

3 Claims, 7 Drawing Figures

U.S. Patent  Feb. 10, 1976  Sheet 1 of 2  3,937,386
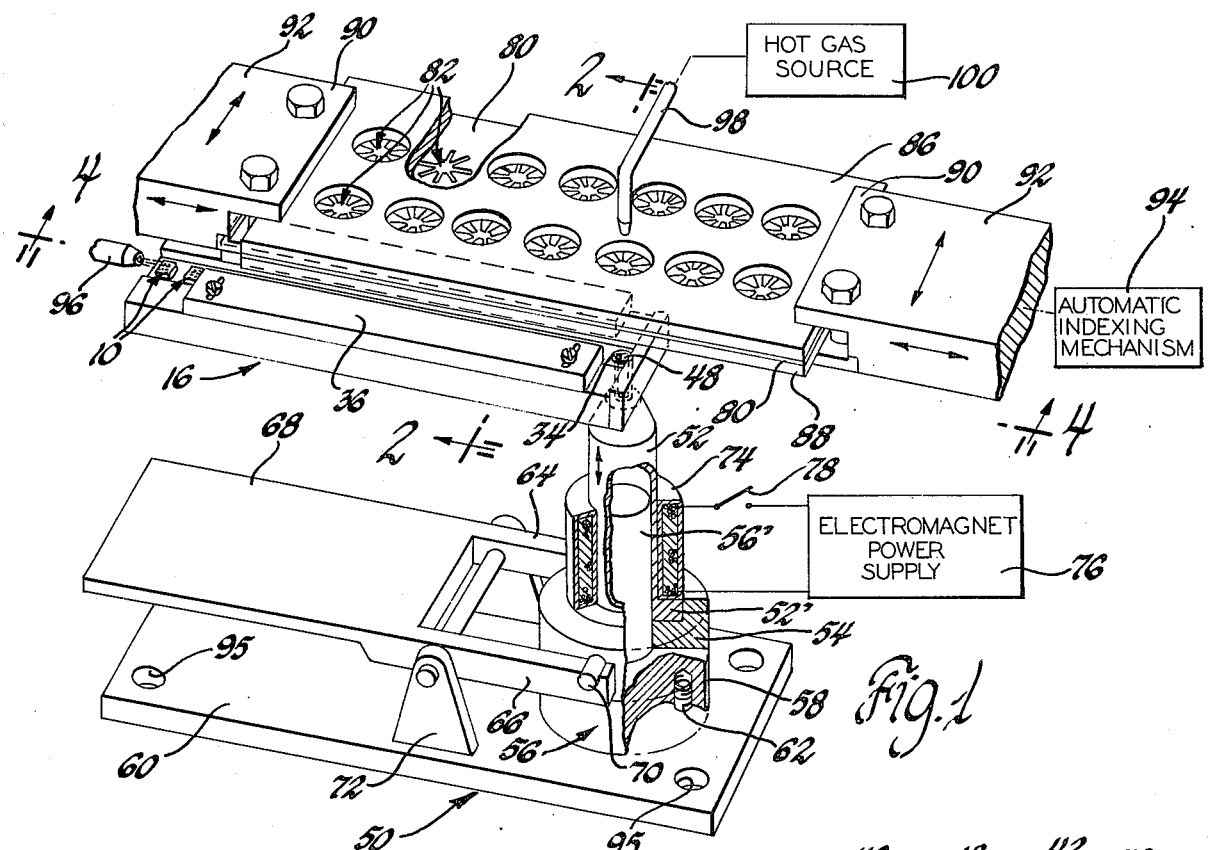
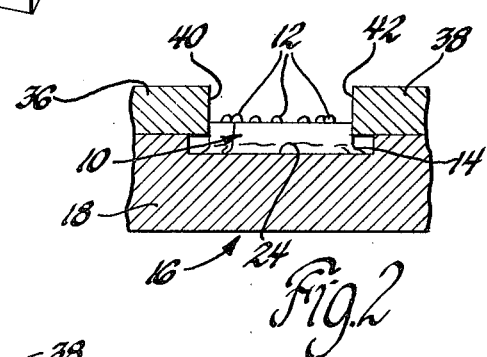
Fig.2
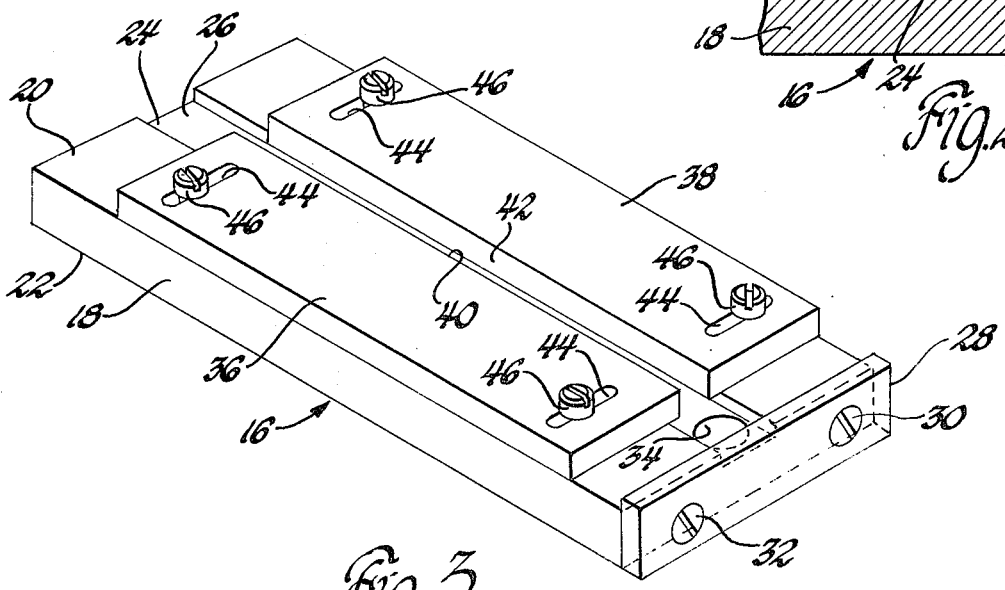
Fig.3

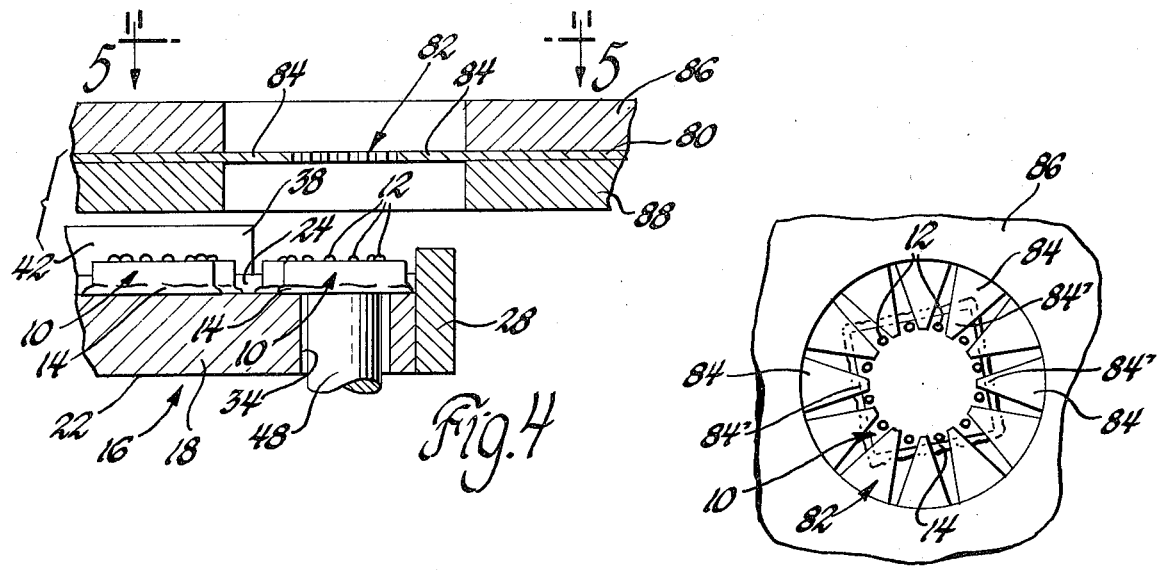
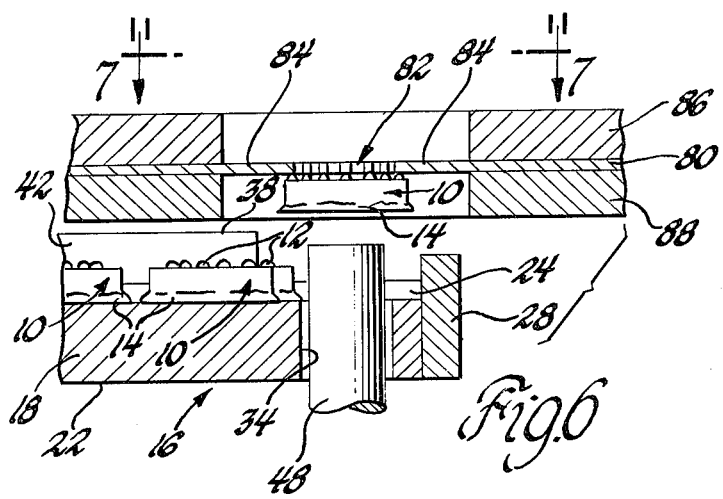
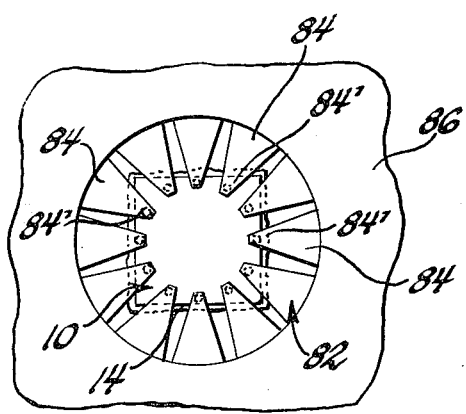

FLIP CHIP CARTRIDGE LOADER

BACKGROUND OF THE INVENTION

This invention relates to a method and apparatus for positioning semiconductor flip chips onto transfer probes for aligning the chips with conductive lead frame structures for bonding. More particularly, it involves a cartridge-type positioning apparatus and a method of using it to successively position semiconductor flip chips onto a magnetized probe which raises the chips from the positioning apparatus and automatically aligns the chips with corresponding fingers of a conductive lead frame so that it can be bonded thereto.

This invention is a production improvement on U.S. Pat. application Ser. No. 414,274, "Magnetic Alignment for Semiconductor Device Bonding", Hartleroad et al, filed concurrently with this application and assigned to the same assignee. In U.S. Pat. application Ser. No. 414,274, now U.S. Pat. No. 3,887,997, there is disclosed a method and apparatus for aligning integrally leaded semiconductors by chips with conductive lead frame structures. In that application, a chip is manually placed on one end of a transfer probe and raised to within close proximity of an overlying set of lead frame fingers. A magnetic force transmitted through the probe automatically orients the integral chip leads with their corresponding lead frame fingers and simultaneously raises the chip off of the probe into engagement with the fingers so that the chips can be bonded thereto. The manual placement of the chip on the transfer probe has proved to be inefficient in high volume production. Furthermore, it has been discovered that the most consistent precise alignment occurs when the integral chip leads are generally aligned with their corresponding lead frame fingers before the chip is magnetically transferred thereto.

A flip chip is an integrally leaded semiconductor device die in which the integral leads extend perpendicularly from a major chip face. These integral leads are often referred to as contact bumps which are extensions of a conductor pattern on the chip face, and serve as electrical interconnection points for larger conductive leads.

It is commonplace in semiconductor device manufacturing to process hundreds of these flip chips simultaneously as part of a single wafer. One of the methods to separate the discrete devices from the wafer is to saw a grid pattern in the wafer between adjacent rows and columns of discrete devices. In the pattern, each discrete device is thus separated from adjacent devices by a surrounding grid pattern. The grid pattern extends more than halfway through the thickness of the wafer. As is known in the art, the wafer is affixed to a flexible, adhesive strip. The back side of the strip is then pulled over a sharp edge to break up the wafer to form a plurality of semiconductor chips, each of which contains a discrete semiconductor device. This dicing method, as it is commonly referred to, leaves burrs on each chip which extends laterally from the lower side portions of the chip that have not been sawed away.

We have invented an apparatus and method of using it which utilizes these burrs to successively position semiconductor flip chips onto the transfer probe disclosed in U.S. Pat. application Ser. No. 414,274, "Magnetic Alignment for Semiconductor Device Bonding", Hartleroad et al.

OBJECTS AND SUMMARY OF THE INVENTION

Therefore, it is an object of this invention to provide a practical production method and apparatus for positioning integrally leaded semiconductor device chips onto a transfer probe which carries the chip into engagement with an overlying lead frame structure for bonding thereto.

It is a more particular object of this invention to provide an efficient production method and apparatus for successively positioning burred semiconductor flip chips onto a transfer probe which magnetically aligns the chips with an overlying conductive lead frame structure for bonding thereto.

It is another object of this invention to provide a method and apparatus which generally aligns semiconductor flip chips with their corresponding lead frame fingers before a transfer probe raises the chips into engagement with the fingers.

These and other objects of this invention are accomplished by placing a plurality of burred semiconductor flip chips into one end of an elongated groove in a cartridge-type positioning apparatus. The chips are moved longitudinally in the groove between two spaced guide rails and are successively located over an opening at the opposite end of the groove. The chips are so located so that they are in general spaced alignment with their overlying corresponding set of lead frame fingers. A probe extends through the opening and engages the back side of the chip thereover. The probe carries the chip into close proximity with the finger set. A magnetic force transmitted through the probe automatically orients the flip chip contact bumps with their corresponding lead frame fingers and simultaneously raises the chip from the probe into precisely aligned engagement with the fingers.

DESCRIPTION OF THE DRAWINGS

FIG. 1 shows an isometric view with parts broken away of the apparatus made in accordance with this invention.

FIG. 2 shows an enlarged fragmentary cross-sectional view along the lines 2—2 of FIG. 1, and which includes a burred semiconductor flip chip therein.

FIG. 3 shows an enlarged isometric view of a positioning apparatus shown in FIG. 1.

FIG. 4 shows a fragmentary sectional view in partial elevation along the lines 4—4 of FIG. 1 before chip transfer to the lead frame.

FIG. 5 shows a top plan view along the lines 5—5 of FIG. 4.

FIG. 6 shows a fragmentary sectional view in partial elevation similar to FIG. 4 but after chip transfer.

FIG. 7 is a top plan view along the lines 7—7 of FIG. 6.

DESCRIPTION OF THE PREFERRED EMBODIMENT

Referring now to the drawings, semiconductor flip chip 10 is a silicon integrated circuit device die. Flip chip 10 is approximately 38 mils square and 11—13 mils thick between its two major faces. The flip chip 10 has a dozen spaced apart contact bumps 12 on its upper face equally spaced about its periphery. Each individual contact bump is approximately 0.8 mils high and 3.8 mils square. For ease of illustration, the contact bumps 12 are shown enlarged with respect to the chip 10. The contact bumps are a composite of layers of aluminum, chromium, nickel, tin and gold, with the outermost layer being gold to permit making a eutectic bond with a gold plated lead frame. While the foregoing bump construction is preferred, it can be varied. However, the nickel content should be at least about 30%, and preferably about 60% by volume of the total contact bump volume, as is the case in this example. The greater than 30% by volume nickel in effect gives the contact bump characteristics of a soft ferromagnetic material. By soft ferromagnetic material we mean a material having a high overall magnetic permeability and a low residual magnetization, with a low coercive field required.

As noted in the background of the invention, the individual chips 10 were once a part of a wafer containing hundreds of discrete device chips. The discrete device chips are separated from the wafer by sawing a grid pattern in the wafer between adjacent rows and columns of discrete devices therein. In the pattern, each discrete device is thus separated from adjacent devices by a surrounding grid pattern. The grid pattern extends more than halfway through the thickness of the wafer. The wafer is then affixed to a flexible, adhesive strip. The back side of the strip is pulled over a sharp edge to break up the wafer along the grid lines to form a plurality of semiconductor chips, each of which contains a discrete semiconductor device. This dicing method inherently leaves burrs 14 on each chip which extends laterally from the lower side portions of the chip. While the exact dimensions of the burrs 14 on individual chips will vary somewhat, generally they will measure approximately 3 mils high and extend laterally about 5 mils from each side of the chip. In contrast, the sides of the chips which have been sawed during the dicing operation are rectilinear and smooth as can be seen in the drawings. Hereinafter, semiconductor device dies having such lateral extensions from its lower side portions will be referred to as a burred semiconductor device.

Particular attention is directed to the cartridge-type positioning apparatus 16 which is shown most clearly in FIG. 3. Positioning apparatus 16 has a rectangular base member 18 which is constructed of a rigid nonferromagnetic material such as SAE Series 300 stainless steel. Base member 18 has two major parallel faces 20 and 22, and has a thickness between these faces of approximately one-half inch.

Groove 24 is centrally located in face 20 and extends longitudinally throughout base member 18. Groove 24 has a bottom portion 26 which is flat with plus-minus 0.003 inch and is substantially parallel to base member face 20. Groove 24 has a width of approximately 50 mils and a depth of approximately 5 mils. It should be noted that the width of groove 24 should be slightly greater than the width of the chip to be placed therein inclusive of the burrs 14 extending therefrom, this being about 48 mils in this example. The depth of groove 24 should be slightly greater than the height of the burrs 14 on the chip.

Stop member 28 extends transversely across one end of groove 24. In this example, stop member 28 is secured to corresponding end of base member 18 by two screws 30 and 32. As can be seen in the drawings, stop member 28 protrudes up pass bottom portion 26 and fits flush against the end of groove 24. It should be noted that while in this example stop member 28 is a discrete member, groove 24 may be terminated before it reaches the end of base member 18 thereby creating an integral stop therein.

Circular opening 34 is centrally located in groove 24 and is spaced about 22 mils from stop member 28, this distance being about one-half the width of semiconductor flip chip 10 inclusive of the burrs 14. Opening 34 extends from bottom portion 26 through base member 18 to surface 22 thereof. The opening 34 has a diameter of approximately 38 mils.

Guide rails 36 and 38 are contiguous base member face 20 and partially overlying groove 24. As can be seen most clearly in FIG. 2, guide rails 36 and 38 have mutually parallel side portions 40 and 42, respectively. These side portions 40 and 42 are spaced apart by approximately 39 mils to accommodate flip chip 10 which has a width between opposing sawed sides of about 38 mils. For purposes of this application unless otherwise noted, the width of semiconductor flip chip 10 will be measured between opposing sawed sides, noninclusive of the burrs 14 extending laterally from its lower side portions. Guide rails 36 and 38 can be spaced at various lengths to accommodate chips of various widths. This is accomplished by two adjustment slots 44 which are transversely cut through the guide rails as can be seen in FIG. 3. The side portions 40 and 42 of the guide rails are spaced at a distance approximately one mil larger than the width of the chip for which it will accommodate. The guide rails are then secured at the desired distance by a series of adjustment screws 46 extending through slot 44 and into base member 18. The guide rails 36 and 38 are spaced from stop member 28 at a distance of about 50 mils so that a chip located over opening 34 can be vertically raised therefrom as will be more fully understood later in this disclosure.

Referring now especially to FIG. 1, the cartridge-type positioning apparatus 16 is mounted on a support (not shown) so that opening 34 is vertically aligned with a probe 48 of a transfer apparatus 50. The transfer apparatus 50 is the same as that disclosed in U.S. Pat. application Ser. No. 414,274, "Magnetic Alignment of Semiconductor Devices for Bonding", Hartleroad et al. The cylindrical probe 48 is constructed of a soft ferromagnetic material such as soft iron or nickel. The probe vertically extends from the upper end of probe holder 52. Probe holder 52 has a flange portion 52' which is seated within a groove on the upper surface of an annular elevator base 54. The major longitudinal portion of probe holder 52 and elevator base 54 have a concentric longitudinal cylindrical opening to receive the cylindrical upper end 56' of base guide 56. The upper end 56' of base guide 56 extends into the longitudinal openings within probe holder 52 and elevator base 54. The probe holder and elevator base are fitted around base guide end 56' so that they slide easily vertically therealong without substantial horizontal deviation. Base guide 56 has a flange 58 at its lower end which is secured to mounting plate 60 as by screws 62. The assembly thus far described is located between the arms 64 and 66 of a yoke portion of lever 68. Elevator base 54 has two oppositely disposed and radially extending bosses 70 which rest on arms 64 and 66 of lever 68. Lever 68 is pivotally mounted on a fulcrum 72 which is attached to mounting plate 60. By depressing lever 68, probe 48 and the members of the transfer apparatus 50 rigidly connected thereto, can be vertically raised while keeping horizontally aligned as they slide along the cylindrical base guide end portion 56'.

An electromagnet coil 74 encircles the periphery of bonding tip holder 52. The coil 74 is 1⅛ inches long and is constructed of No. 38 gauge enamelled copper wire 63 turns long and 10 turns deep. Coil 74, in conjunction with probe holder 52 form an electromagnet. The electromagnet can be energized as is well known in the art by a typical DC power supply 76, which is series connected with the coil 74 and a switch 78. Preferably, in practicing this invention, the power supply should provide an average of 15 volts and 0.45 ampere to the coil 74.

A conductive gold-plated lead frame structure 80 has a plurality of spaced apart sets 82 of mutually convergent cantilevered fingers 84. The fingers 84 have inner free ends 84' which correspond to the contact bump 12 pattern on semiconductor flip chip 10. The lead frame in this example is constructed of Alloy 42 which is an alloy containing by weight, about 41.5% nickel, 0.05% carbon, 0.5% manganese, 0.25% silicon, and the balance iron. Two identical cover plates 86 and 88 sandwich the lead frame 80 therebetween. The cover plates have a plurality of circular openings therein which expose the sets 82 of lead frame fingers 84. The cover plate 86, 88 and lead frame 80 are held in mutual registration by means of clamps 90 on the ends of arms 92 can be seen in FIG. 1. The arms 92 are connected to a supporting automatic indexing mechanism 94 designated by the box in FIG. 1. The lead frame 80 is supported parallel to the mounting plate 60 of the transfer apparatus 50, the mounting plate being secured to a flat, rigid surface (not shown) through mounting holes 95 therein. The automatic indexing mechanism 94 moves the lead frame in the direction of the arrows of FIG. 1 to progressively position the sets 82 of fingers 84 over the opening 34 in the positioning apparatus 16.

According to the method of our invention, discrete semiconductor flip chips 10 are separated from the wafer by the dicing method as hereinbefore described. The chips 10 are transferred from the adhesive strip used in the dicing operation into one end of the elongated groove 24. This can be accomplished by a typical pick and place mechanism which retains the chip orientation that it had while being secured to the adhesive strip. However, the chips can be placed into the groove manually. The chips are placed one at a time into the groove 24 so that the contact bumps 12 are oriented upwardly. The flip chips are then moved longitudinally down said groove until the first chip abuts stop member 28. The chips can be shuttled down the groove by means of an air pressure from nozzle 96 which blows against the chips within the groove, or manually by pushing or pulling the chips down the groove.

As can be seen in FIG. 2, guide rails 36 and 38 contact only the smooth sides of the chips therein and, therefore, allow the chips to move freely along the groove. However, the guide rails prevent the chips from vertically separating from the groove as they are spaced close enough to prevent the burrs 12 of the chips from passing therethrough.

FIG. 4 shows the flip chips 10 after they have been moved down the groove so that the first chip abuts stop member 28. As can be seen in this figure, this locates the chips over opening 34 in the cartridge positioning apparatus 16. By referring to FIG. 5, it can be seen that the flip chip in the groove 24 is in general alignment with the overlying set of lead frame fingers 84 since the positioning apparatus 16 has been positioned so that the opening 34 is generally aligned with the finger set.

The groove which is but slightly larger than the chips keeps them generally aligned. However, the contact bumps 12 will probably not be precisely aligned with their corresponding finger-free end 84'. We have discovered that this general alignment of the chip with the lead frame finger increases the yields during production in that it promotes precise aligned engagement of the contact bump and lead frame fingers as will now be described.

The electromagnet coil 74 is energized by closing switch 78. The lever 68 of transfer apparatus 50 is then depressed to extend the probe 48 through opening 34 of the positioning apparatus 16. The probe 48 engages the back side of the chip 10 which is located over the opening 34 and raises it into close proximity with the overlying lead frame fingers 84. When the flip chip 10 is brought close enough to the underside of the fingers, the magnetic force which is transmitted through the soft ferromagnetic probe 48 raises the chip the rest of the way to the underside of the fingers 84 as can be seen in FIGS. 6 and 7. In moving from the probe toward the fingers, the flip chip also is concurrently automatically oriented by magnetic flux lines concentrated in the lead frame fingers and the chip contact bumps so that when the contact bump 12 engages the respective finger free ends 84', they are precisely aligned therewith. This orientation can occur or after the chip raises off the probe, but will always occur before the contact bumps engage their respective finger free end.

Once the engagement is made between the contact bumps 12 and fingers 84, they are permanently bonded together by a hot gas blast from bonding torch 98. Typically, the hot gas is a nitrogen and hydrogen gas mixture at a temperature of approximately 500°C. which is supplied from a source 100, designated by the box in FIG. 1, communicating with the torch 98. The hot gas melts the tin in the bump and gold outer surfaces of the contact bumps 12 and fingers 84 dissolve in the tin to form a melt. The hot gas is then removed and the melt resolidifies to form a permanent electrical and mechanical connection between the flip chip bumps 12 and the lead frame fingers 84.

This cycle can be repeated by withdrawing the probe 48 from the openings 34 and propelling the next chip by the air pressure from nozzle 96 further down the groove 26 until it abuts stop member 28. A new set 82 of lead frame fingers 84 is then positioned by the automatic indexing means 94 so that the set 82 overlies the opening 34 of the positioning apparatus 16. The probe 48 then again extends through the opening and engages the chip thereover to align it with the overlying lead frame structure.

Although this invention has been described in connection with certain specific examples thereof, no limitation is intended thereby except as defined in the appended claims.

We claim:

1. In a system for bonding integrally leaded semiconductor device chips to conductive lead frame structures including a transfer apparatus having a probe extending vertically therefrom, an apparatus for successively positioning onto said probe semiconductor device chips having opposite parallel smooth edges and protruding burrs on said opposite edges contiguous one face, said apparatus comprising a base member having an elongated groove in one surface thereof, said groove having a width slightly greater than the width of said semiconductor device chips inclusive of burrs, said groove having a constant depth along its length, said depth being less than the thickness of said chips and greater than the height of said burrs on said chip edges, a stop member extending transversely across one end of said groove, an opening located about a center line spaced approximately one-half the width of said chip inclusive of said burrs from said stop member, said opening extending from the groove bottom to an opposite surface of said base member, two spaced juxtapositioned guide rails on said one surface of said base member, said guide rails partially overlying said groove and extending substantially the length thereof, said guide rails spaced apart at a distance slightly greater than the width of burred semiconductor device chip noninclusive of said burrs and less than the width of said chip inclusive of said burrs for contact with only relatively smooth opposite scribed edges of said chip, wherein said chip is free to traverse said groove but closely maintains a predetermined orientation therein, adjacent ends of said guide rails being spaced from said stop member slightly greater than the width of the chip inclusive of said burrs, so that the probe of the transfer apparatus may extend through said opening and engage the back side of the chip thereover to align it with an overlying conductive lead frame structure.

2. A system for bonding integrally leaded semiconductor device chips to a conductive lead frame that includes an automatic chip positioning apparatus, said system comprising:

means for horizontally supporting a conductive lead frame structure having a plurality of sets of soft ferromagnetic spaced convergent cantilevered fingers;

means for transferring semiconductor chips having soft ferromagnetic integral leads on one face thereof to an overlying set of lead frame fingers for bonding thereto, said transfer means having a soft ferromagnetic probe extending vertically therefrom;

means for applying a magnetic field to said probe so that magnetic lines of flux are transmitted longitudinally therethrough, said magnetic field having a strength sufficient to raise a chip up from the probe into engagement with said lead frame fingers;

apparatus for successively positioning semiconductor chips onto one end of the probe, said apparatus having a base member with a longitudinal groove in one surface thereof, said groove having a generally flat bottom portion, a stop member extending transversely across one end of the groove, an opening extending from said groove bottom portion to an opposite surface of said base member, said opening being centrally located in said groove bottom portion and spaced from said stop member so as to be disposed underneath a semiconductor chip in said groove which is abutted against the stop member, means contiguous said one base member surface and overlying said groove for retaining semiconductor chips in the groove, said means being spaced from said stop member and said opening so that a semiconductor chip located over the opening can be vertically raised therefrom;

means for moving a plurality of semiconductor chips longitudinally down said groove to successively abut the chips against said stop member so that said probe can extend through the opening and raise the chip thereover closer to the overlying set of lead frame fingers, where said magnetic force transmitted through the probe can raise the chip up from the probe to the fingers and concurrently orient the chip so that the integral chip leads are precisely aligned with their corresponding fingers upon engagement therewith; and means for bonding said chip to the lead frame.

3. A method of positioning burred semiconductor flip chips onto a probe for magnetically aligning the chip with an overlying conductive lead frame for bonding thereto, said method comprising the steps of:

dicing a semiconductor wafer to separate a plurality of discrete flip chips therefrom, said chips having burrs extending laterally from their lower side portions;

placing a burred semiconductor flip chip having a plurality of soft ferromagnetic contact bumps on one face thereof into one end of an elongated groove in a positioning apparatus, said apparatus having spaced juxtapositioned guide rails overlying the substantial length of said groove, a stop member extending transversely across the opposite end of the groove, and an opening centrally located in said groove which extends completely through said apparatus with the opening being spaced from the stop member at a distance of about one-half the width of the chip including the burrs;

positioning a conductive lead frame having sets of soft ferromagnetic spaced fingers corresponding to said flip chip contact bumps so that a finger set overlies the opening in the positioning apparatus;

moving said chip longitudinally in said groove between said guide rails to abut the chip against said stop member and locate said chip over said opening thereby positioning the flip chip contact bumps into general spaced alignment with their overlying corresponding fingers;

applying a magnetic field to a soft ferromagnetic probe so that magnetic lines of flux are transmitted longitudinally therethrough;

extending said probe through said opening to engage the back side of the chip thereover;

raising the chip with said probe to within close proximity of said lead frame fingers whereby the magnetic force from said probe raises said chip the rest of the way to the fingers and concurrently automatically orients the chip while in transit thereto so that said contact bumps are in precise aligned engagement with their corresponding lead frame fingers; and heating said contact bump-finger engagement to permanently bond said flip chip to said lead frame.

* * * * *